(12) United States Patent
Huang et al.

(10) Patent No.: US 12,041,834 B2
(45) Date of Patent: Jul. 16, 2024

(54) DISPLAY DEVICE

(71) Applicant: AU Optronics Corporation, Hsin-Chu (TW)

(72) Inventors: Zih-Shuo Huang, Hsin-Chu (TW); Tsung-Ying Ke, Hsin-Chu (TW)

(73) Assignee: AU OPTRONICS CORPORATION, Hsin-Chu (TW)

( * ) Notice: Subject to any disclaimer, the term of this patent is extended or adjusted under 35 U.S.C. 154(b) by 449 days.

(21) Appl. No.: 17/486,973

(22) Filed: Sep. 28, 2021

(65) Prior Publication Data

US 2022/0149119 A1    May 12, 2022

Related U.S. Application Data

(60) Provisional application No. 63/111,698, filed on Nov. 10, 2020.

(30) Foreign Application Priority Data

Jun. 8, 2021  (TW) ................................ 110120828

(51) Int. Cl.
  *H10K 59/35*   (2023.01)
  *H10K 59/131*  (2023.01)

(52) U.S. Cl.
  CPC ......... *H10K 59/353* (2023.02); *H10K 59/131* (2023.02)

(58) Field of Classification Search
  None
  See application file for complete search history.

(56) References Cited

U.S. PATENT DOCUMENTS

| | | | |
|---|---|---|---|
| 2004/0259038 A1 | 12/2004 | Watanabe et al. | |
| 2006/0169989 A1* | 8/2006 | Bhattacharya | H10K 50/80 428/917 |
| 2014/0299362 A1* | 10/2014 | Park | H05K 1/0283 174/254 |
| 2017/0279057 A1 | 9/2017 | Park et al. | |
| 2019/0088894 A1 | 3/2019 | Park et al. | |
| 2020/0035778 A1 | 1/2020 | Kim et al. | |
| 2020/0203312 A1* | 6/2020 | Yun | H10K 77/111 |
| 2020/0211437 A1 | 7/2020 | Ahn et al. | |
| 2020/0350506 A1* | 11/2020 | Cho | H10K 77/111 |
| 2021/0013433 A1 | 1/2021 | Zhai | |
| 2021/0083211 A1 | 3/2021 | Park et al. | |
| 2021/0233993 A1 | 7/2021 | Kim et al. | |

FOREIGN PATENT DOCUMENTS

| | | |
|---|---|---|
| CN | 111710242 A | 9/2020 |
| TW | 202008579 A | 2/2020 |

* cited by examiner

*Primary Examiner* — Evren Seven
(74) *Attorney, Agent, or Firm* — WPAT, P.C

(57) ABSTRACT

A display device includes: a substrate, a plurality of pixel islands, and a plurality of traces. The substrate is stretchable. The plurality of pixel islands are disposed over the substrate. The plurality of traces respectively connect two adjacent pixel islands of the plurality of pixel islands, and each of the traces extends in a first main direction and then extends in a second main direction through a turning angle.

18 Claims, 11 Drawing Sheets

DISPLAY DEVICE

CROSS-REFERENCE TO RELATED APPLICATION

This application claims priority to U.S. Provisional Application Ser. No. 63/111,698 filed Nov. 10, 2020, and Taiwan Application Serial Number 110120828, filed Jun. 8, 2021, the disclosures of which are incorporated herein by reference in their entireties.

BACKGROUND

Field of Invention

The present disclosure relates to a stretchable display device with traces that can withstand tensile strain.

Description of Related Art

With the development of display technology, various forms of display devices appear constantly, such as curved display panels and flexible display panels, which are gradually applied in the fields of screens, electronic billboards, wearable devices, internet devices, artificial intelligence device, or the like, to bring users new viewing and using experiences.

With regard to the technical development of stretchable display devices, stretchable traces and separated island-like electronic components are gradually adopted. Therefore, when the display device is stretched under a force, the main deformation may be concentrated in the traces region, and damage to the non-stretchable island-like electronic components can be avoided. However, the traces between island-like electronic components are often subject to greater stress, so that the traces are very likely to break when or after the display device is stretched.

SUMMARY

Some embodiments of the present disclosure provide a display device including: a substrate, a plurality of pixel islands, and a plurality of traces. The substrate is stretchable. The plurality of pixel islands are disposed over the substrate. The plurality of traces respectively connect two adjacent pixel islands of the plurality of pixel islands, and each of the traces extends in a first main direction and then extends in a second main direction through a turning angle.

In some embodiments, in the display device, the turning angle is 70° to 110° before the substrate is subjected to tensile s tress.

In some embodiments, in the display device, the turning angle is 75° to 175° when the substrate is subjected to tensile stress.

In some embodiments, in the display device, the traces extending from one side of one pixel island of the pixel islands connect one side of another pixel island of the pixel islands.

In some embodiments, in the display device, the angle between one side of each of the pixel islands and the direction to be stretched of the substrate is 30° to 60°.

In some embodiments, in the display device, the angle between a main extending direction of the traces and the direction to be stretched of the substrate is 35° to 55°.

In some embodiments, in the display device, the plurality of pixel islands comprise a first pixel island, a second pixel island, and a third pixel island, some of the traces extending from one side of the first pixel island connect one side of the second pixel island, and other of the traces extending from the side of the first pixel island connect one side of the third pixel island.

In some embodiments, in the display device, some of the plurality of traces extending from another side of the first pixel island connect another side of the second pixel island.

In some embodiments, in the display device, the first pixel islands have a first side, a second side, a third side, and a fourth side, the first side intersects the second side and is opposite to the third side, the second side intersects the third side and is opposite to the fourth side. The plurality of traces comprises first traces, second traces, third traces, and fourth traces. The first side of the first pixel islands is connected with the first traces, the second side is connected with the second traces, the third side is connected with the third traces, and the fourth side is connected with the fourth traces. The first traces on the first side are respectively electrically coupled to the third traces on the third side, and the second traces on the second side are respectively electrically coupled to the fourth traces on the fourth side.

In some embodiments, in the display device, the first pixel island has a plurality of first conductive lines and a plurality of second conductive lines, the first traces on the first side are respectively electrically coupled to the third traces on the third sides via the plurality of first conductive lines, and the second traces on the second side are respectively electrically coupled to the fourth traces on the fourth side via the plurality of second conductive lines.

In some embodiments, in the display device, the plurality of first conductive lines and the plurality of second conductive lines are located at different levels in the first pixel island.

In some embodiments, in the display device, the outermost trace of the first traces on the first side are respectively electrically coupled to the innermost trace of the third traces on the third side, and the innermost trace of the first traces on the first side are respectively electrically coupled to the outermost trace of the third traces on the third side.

In some embodiment, in the display device, the respective conductive paths from the first traces to the third traces are approximately equal in length. In some embodiment, in the display device, the respective conductive paths from the second traces to the fourth traces are approximately equal in length.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1A:
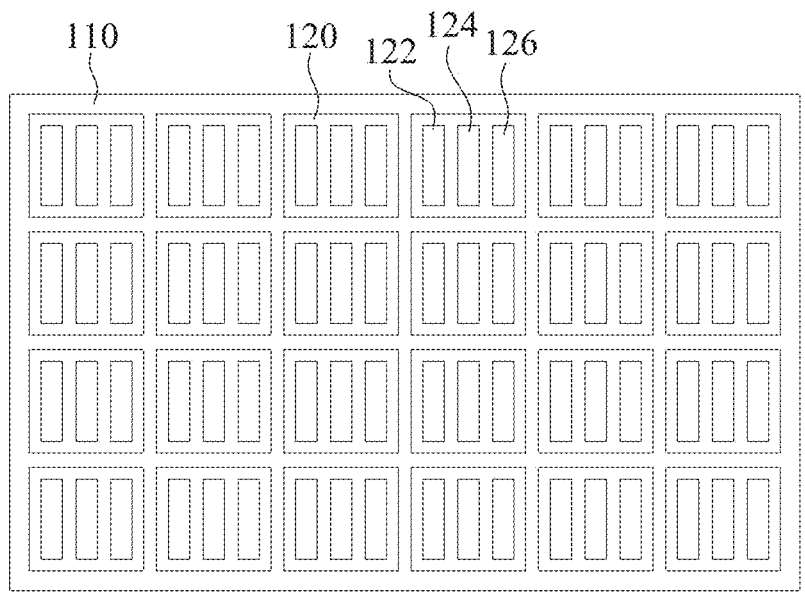
FIG. 1A is a schematic top view of a display device according to some embodiments.

The following will clearly illustrate the spirit of this disclosure with the drawings and detailed description. After understanding the preferred embodiments and examples of the disclosure, any person having ordinary skill in the art can change and modify the technology taught by the disclosure without departing from the spirit and scope of the disclosure.

Throughout the specification, the same reference numerals refer to the same elements. It is understood that when an element, such as a layer, film, region or substrate, is said to be "on" or "connected" to another element, it may be directly on or connected to another element, or an intermediate element may also exist. On the contrary, when an element is referred to as being "directly on another component" or "directly connected" to another component, there is no intermediate element. As used herein, "connection" may refer to a physical and/or electrical connection. Furthermore, "electrical connection" or "coupling" can mean that other elements exist between two elements.

It is understood that although the terms "first", "second", "third", or the like may be used herein to describe various elements, components, regions, layers and/or portions, but these elements, components, regions and/or portions should not be limited by these terms. These terms are only used to distinguish one element, component, region, layer or portion from another element, component, region, layer or portion. Therefore, the first element, component, region, layer, or portion discussed below may be referred to as the second element, component, region, layer, or portion without departing from the teachings of the disclosure.

The terminology used here is for description of particular embodiments only and is not limiting. As used herein, the singular forms "one", "a" and "the" are intended to include the plural forms, including "at least one", unless the context clearly indicates otherwise. "Or" means "and/or". As used herein, the term "and/or" includes any and all combinations of one or more related listed items. It is also understood that when used in this specification, the terms "comprising" and/or "including" specify the presence of stated features, regions, integers, steps, operations, elements and/or components, but do not exclude the presence or addition of one or more other features, regions, steps, operations, elements, components and/or combinations thereof.

As used herein, "about", "approximate", or "substantially" includes the stated value and an average value within an acceptable deviation range of a specific value determined by one of ordinary skill in the art, and the measurement in question and a specific number of errors related to the measurement (i.e., limitations of the measurement system) are taken into account. For example, "about" may mean within one or more standard deviations of the value, or within ±30%, ±20%, ±10%, or ±5%. Furthermore, the terms "about," "approximately," or "substantially" as used herein may be used to select a more acceptable range of deviations or standard deviations depending on the optical properties, etching properties, or other properties, rather than one standard deviation for all properties.

Unless otherwise defined, all terms used herein, including technical and scientific terms, have the same meaning as commonly understood by one of ordinary skill in the art of the invention. It will be further understood that terms such as those defined in commonly used dictionaries shall be construed to have a meaning consistent with their meaning in the context of the relevant art, and the invention and will not be construed to have an idealized or overly formal meaning unless explicitly defined as such herein.

Exemplary embodiments are described herein with reference to schematic top views of idealized embodiments. Thus, a change in shape of the illustration as a result of, for example, manufacturing techniques and/or tolerances can be expected. Accordingly, the embodiments described herein should not be construed as being limited to a particular shape of the region as shown herein, but include, for example, including manufacturing-induced shape deviations. For example, regions shown or described as flat can often have rough and/or non-linear characteristics. In addition, the sharp corners shown may be rounded. Therefore, the regions shown in the figures are schematic in nature, and their shapes are not intended to show the exact shape of the regions, and are not intended to limit the scope of the claims.

FIG. 1A illustrates a schematic top view of a display device according to some embodiments. A display device 100 includes a substrate 110 and a plurality of pixel islands 120 over the substrate 110. Each of the pixel islands 120 may include a plurality of sub-pixels 122, 124, and 126. In some embodiments, one of the plurality of sub-pixels 122, 124, and 126 may be a red sub-pixel, another may be a green sub-pixel, and yet another may be a blue sub-pixel.

Figure 1B:
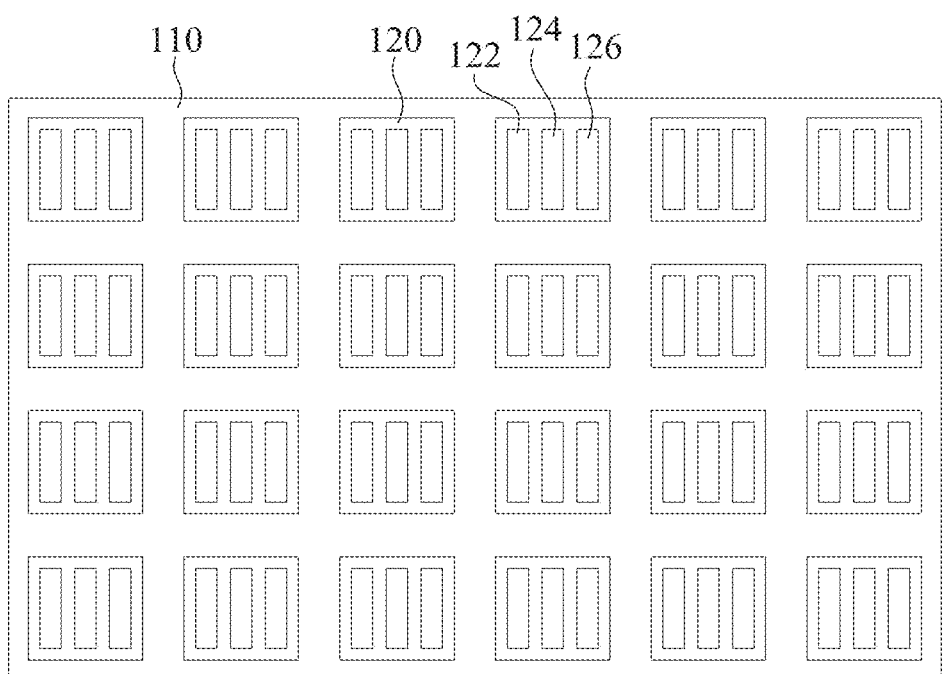
FIG. 1B is a top view of the stretched display device of FIG. 1A.

FIG. 1B shows a schematic top view of the stretched display device 100, the sizes of the various pixel islands 120 remain basically unchanged, and the distance between the pixel islands 120 increases.

Figure 2A:
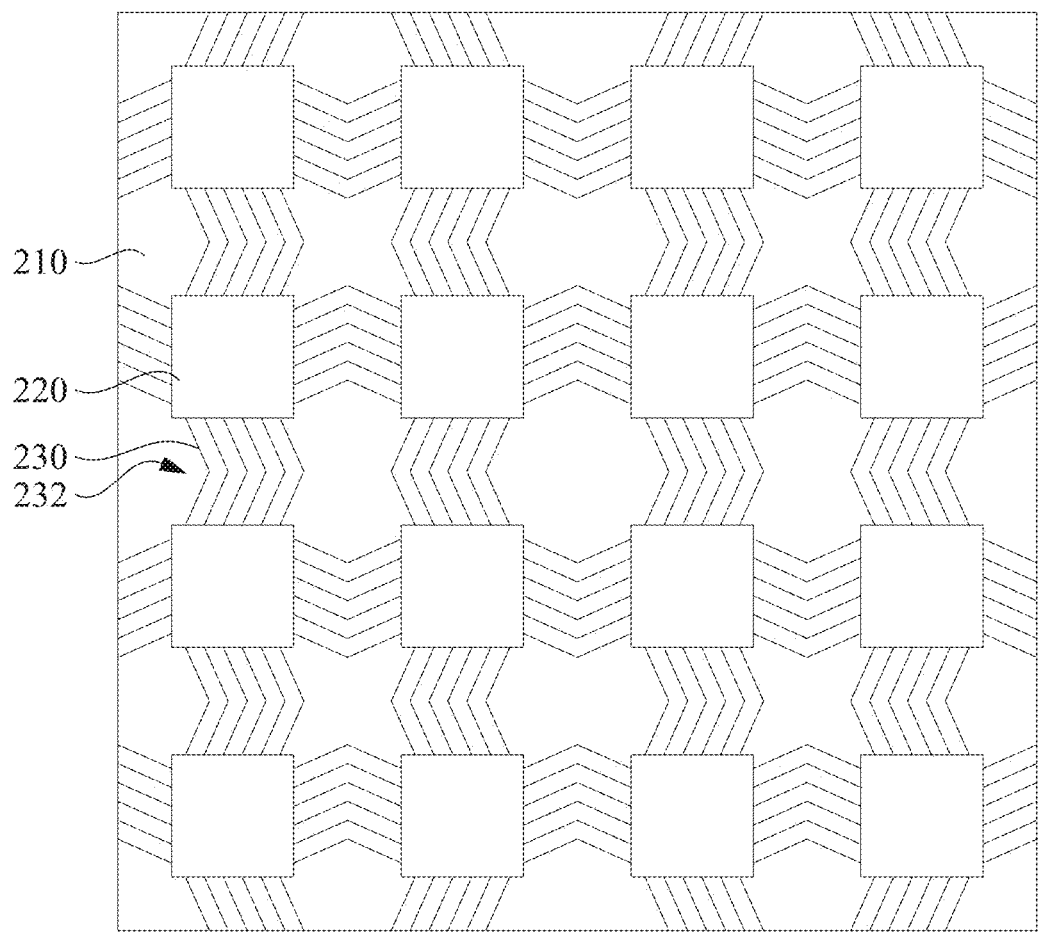
FIG. 2A is a top view of a partial region of a display device according to some embodiments.

FIG. 2A illustrates a schematic partial top view of a display device according to some embodiments. A display device 200 includes a substrate 210 and a plurality of pixel islands 220 over the substrate 210, and adjacent pixel islands 220 are connected to each other via a plurality of traces 230.

The material of the substrate 210 is a material that leads the substrate 210 flexible and stretchable, such as thermoplastic polyurethanes (TPU), poly (dimethylsiloxane (PDMA), hexamethyldisilxane (HMDSO), or the like.

The pixel islands 220 have no tensile or compressive strain when the substrate 210 is stretched or compressed. Each of the pixel islands 220 may include one or more sub-pixels. Each of the pixel islands 220 may also have a thin film transistor and signal lines connected to the thin film transistor, such as scanning signal lines, data signal lines, power signal lines, ground signal lines, or the like. In the pixel islands 220, the sub-pixels used for display can be light emitting diode (LED) elements, such as organic LED elements, micro LED elements, or the like, and other suitable display elements, such as quantum dot light emitting elements, can also be used.

The traces 230 may be or comprise: power (VDD or VSS) traces, data traces, reference voltage traces, gate switch traces, pulse width modulation (PWM) traces, AC signal traces, DC signal traces, or the like. The traces 230 may be an electrical wire with a single-layer structure, a double-layer structure or a multi-layer structure. The traces 230 have elastic tensile properties and are not easy to break. The traces 230 enable the signals between adjacent pixel islands 220 to communicate with each other. It is understood that the number of traces depicted in the drawings of the embodiments herein is exemplary and only for illustration, and the number of traces may be more or less than the number of traces depicted in the drawings.

Each of the traces 230 comprises a turning angle 232. For the conventional design of traces, the main extending direction of the traces between adjacent pixel islands is a straight line; when a display device is subjected to tensile stress, the straight traces are deformed. However, the amount of deformation that the traces can bear is limited; for example, if the traces suffer more than about 6% deformation, they may easily break, especially at the sites where the traces connect with a pixel island. In some embodiments of the present disclosure, through the design of the turning angle 232, when a trace is stretched, the bending angle of the turning angle 232 can be increased, so the trace 230 can share the strain on the trace through rotation.

As used herein, the term "turning angle" of a trace refers to the angle between the main extending directions of the trace. In some embodiments, local portions of the traces may be set in a curved shape, such as horseshoe shape, wave shape, sawtooth shape, or the like, as shown in the following FIG. 2B and FIGS. 3B to 3E.

Figure 2B:
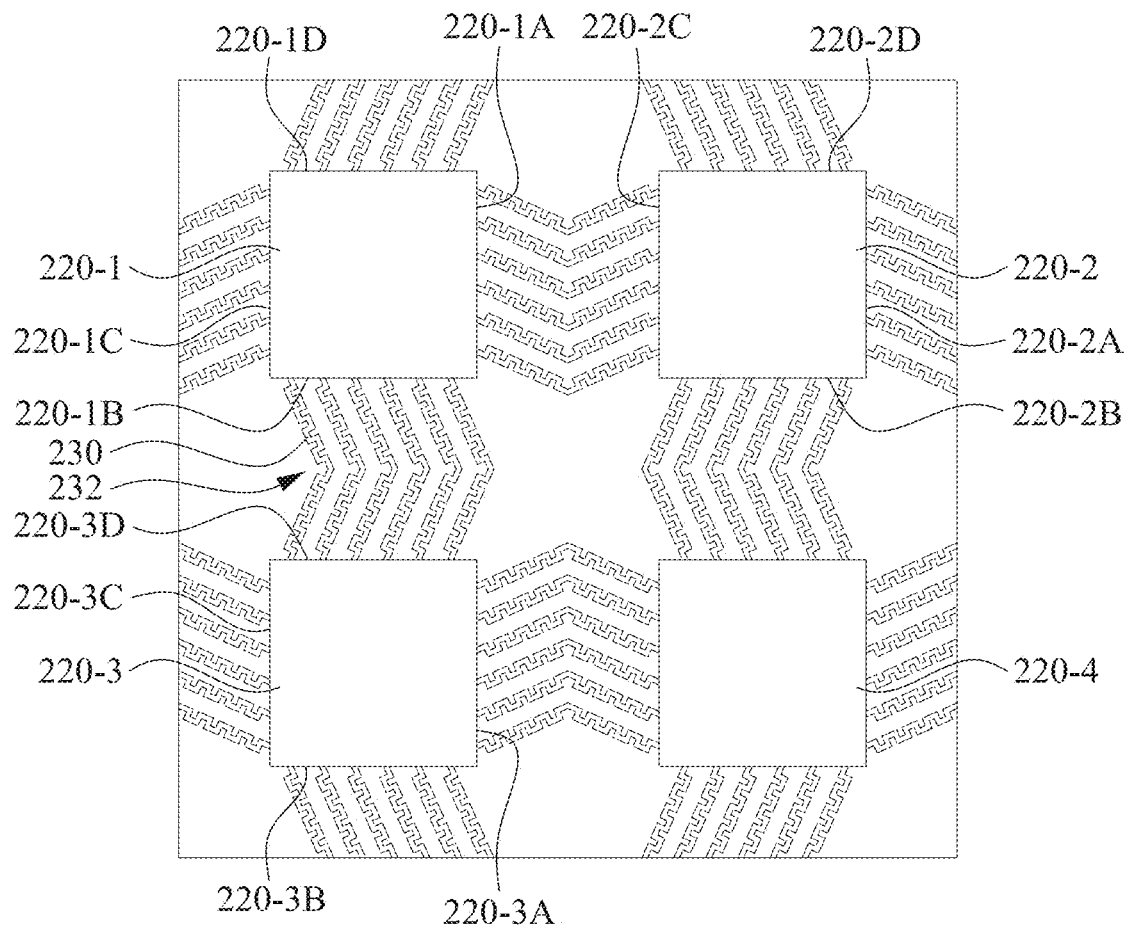
FIG. 2B is a partial enlarged view of FIG. 2A.

FIG. 2B illustrates a partial enlarged view of FIG. 2A. FIG. 2B illustrates a first pixel island 220-1, a second pixel island 220-2, a third pixel island 220-3, and a fourth pixel island 220-4. The first pixel island 220-1 is adjacent to the second pixel island 220-2 in a first direction and adjacent to the third pixel island 220-3 in a second direction different from the first direction.

In the exemplary embodiment of FIG. 2B, all of the pixel islands have four sides. The first pixel island 220-1 has a first side 220-1A, a second side 220-1B, a third side 220-1C, and a fourth side 220-1D. The second pixel island 220-2 has a first side 220-2A, a second side 220-2B, a third side 220-2C, and a fourth side 220-2D. The third pixel island 220-3 has a first side 220-3A, a second side 220-3B, a third side 220-3C, and a fourth side 220-3D. The plurality of traces 230 extending from the first side 220-1A of the first pixel island 220-1 connect the third side 220-2C of the second pixel island 220-2. The plurality of traces 230 extending from the second side 220-1B of the first pixel island 220-1 connect the fourth side 220-3D of the third pixel island 220-3. In other words, the traces on one side of the first pixel island 220-1 connect one side of the second pixel island 220-2, and traces on the other side of the first pixel island 220-1 connect to one side of the third pixel island 220-3.

Figure 3A:
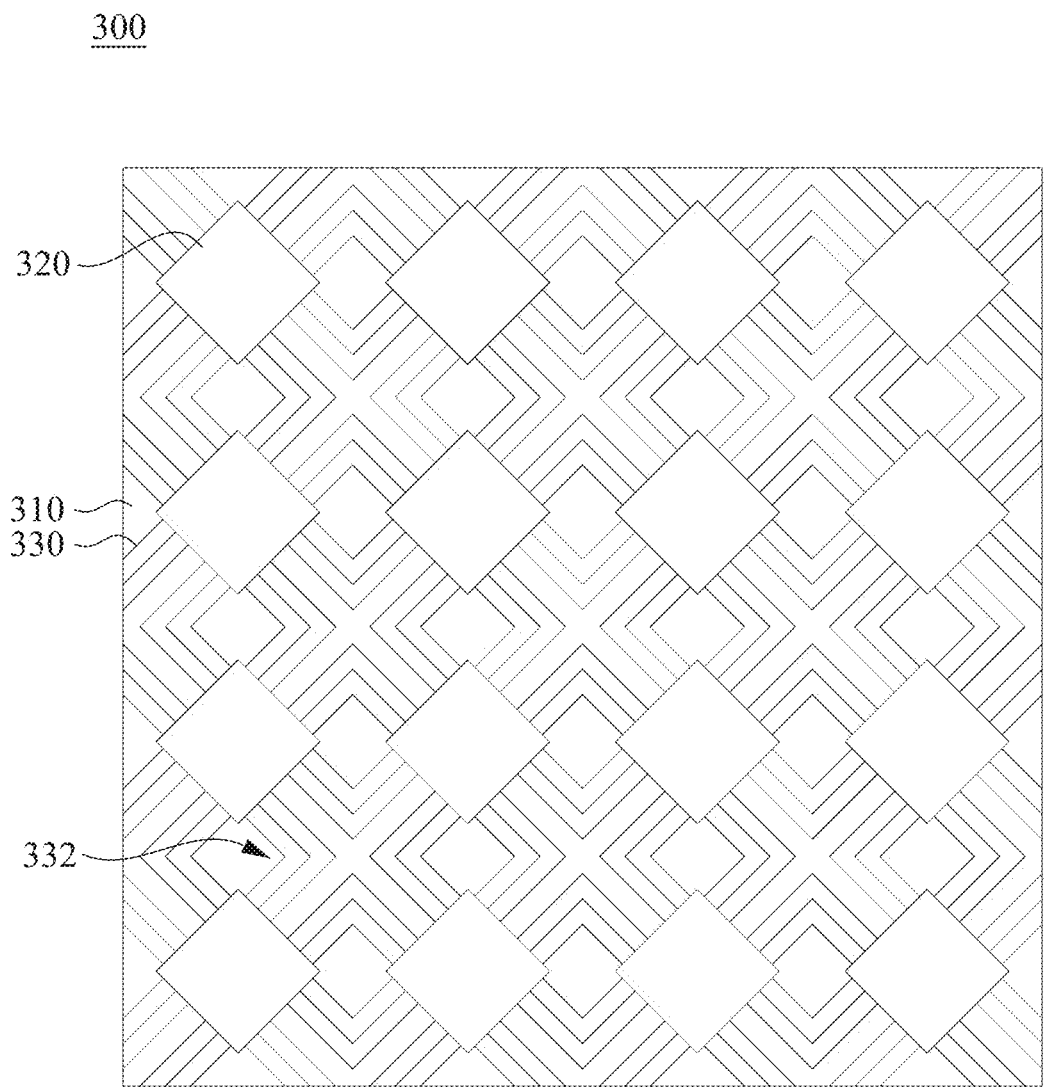
FIG. 3A is a top view of a partial region of a display device according to some embodiments.

FIG. 3A illustrates a schematic partial top view of a display device according to other embodiments. A display device 300 includes a substrate 310 and a plurality of pixel islands 320 over the substrate 310, and adjacent pixel islands 320 are connected to each other via a plurality of traces 330. Each of the traces 330 has a turning angle 332 near the middle of the traces.

Figure 3B:
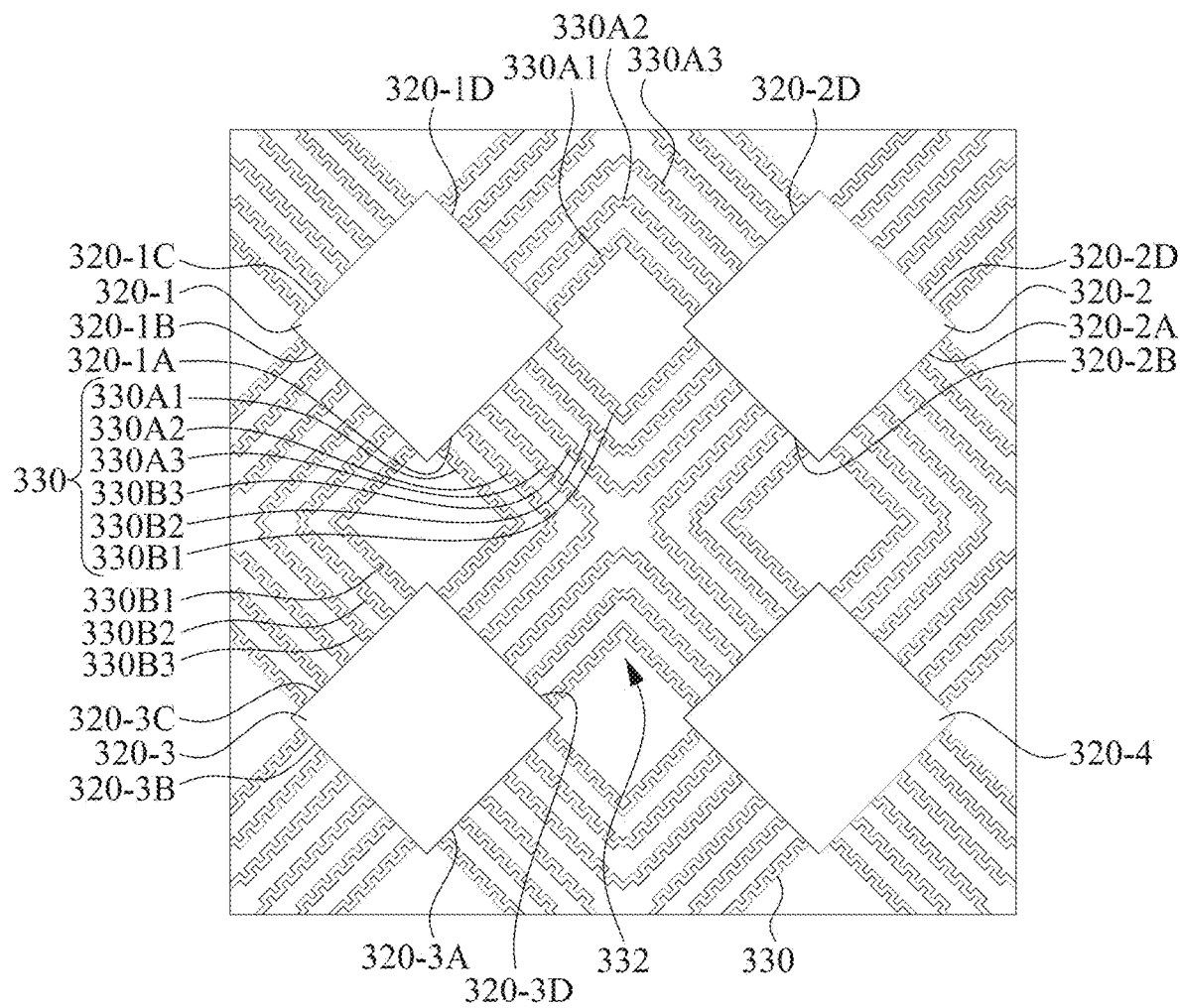
FIG. 3B is a partial enlarged view of FIG. 3A.

FIG. 3B is a partial enlarged view of FIG. 3A. FIG. 3B illustrates a first pixel island 320-1, a second pixel island 320-2, a third pixel island 320-3, and a fourth pixel island 320-4. The first pixel island 320-1 is adjacent to the second pixel island 320-2 in a first direction and adjacent to the third pixel island 220-3 in a second direction different from the first direction. The traces 330 connecting the first pixel island 320-1 and the second pixel island 320-2, the traces 330 connecting the second pixel island 320-2 and the fourth pixel island 320-4, the traces 330 connecting the fourth pixel island 320-4 and the third pixel island 320-3, and the traces connecting the third pixel island 320-3 and the first pixel island 320-1 are disposed in the region between the pixel islands 320-1, 320-2, 320-3 and 320-4. Therefore, the embodiments shown in FIGS. 3B to 3E can better utilize the space between the pixel islands in the panel region.

In the exemplary embodiment of FIG. 3B, each of the pixel islands has four sides. The first pixel island 320-1 has a first side 320-1A, a second side 320-1B, a third side 320-1C, and a fourth side 320-1D. The second pixel island 320-2 has a first side 320-2A, a second side 320-2B, a third side 320-2C, and a fourth side 320-2D. The third pixel island 320-3 has a first side 320-3A, a second side 320-3B, a third side 320-3C, and a fourth side 320-3D. A plurality of traces 330B1, 330B2 and 330B3 extending from the first side 320-1A of the first pixel island 320-1 connect the second side 320-2B of the second pixel island 320-2. A plurality of traces 330A1, 330A2 and 330A3 extending from the first side 320-1A of the first pixel island 320-1 connect the fourth side 320-3D of the third pixel island 320-3. In other words, among the plurality of traces from the first side 320-1A of the first pixel island 320-1, some traces extend to the second pixel island 320-2, and other traces extend to the third pixel island 320-3.

Figure 3C:
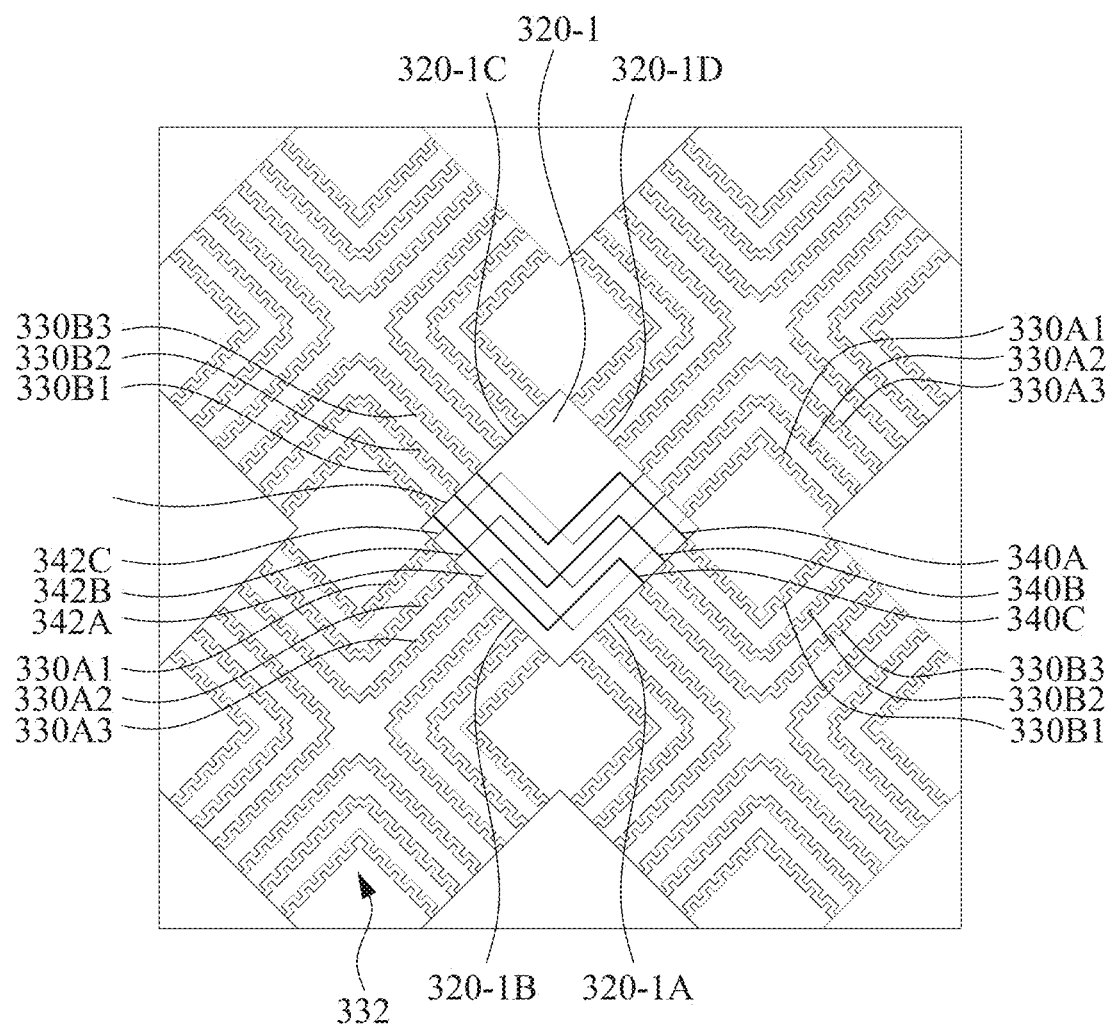
FIG. 3C is a partial enlarged view of FIG. 3A.
Figure 3D:
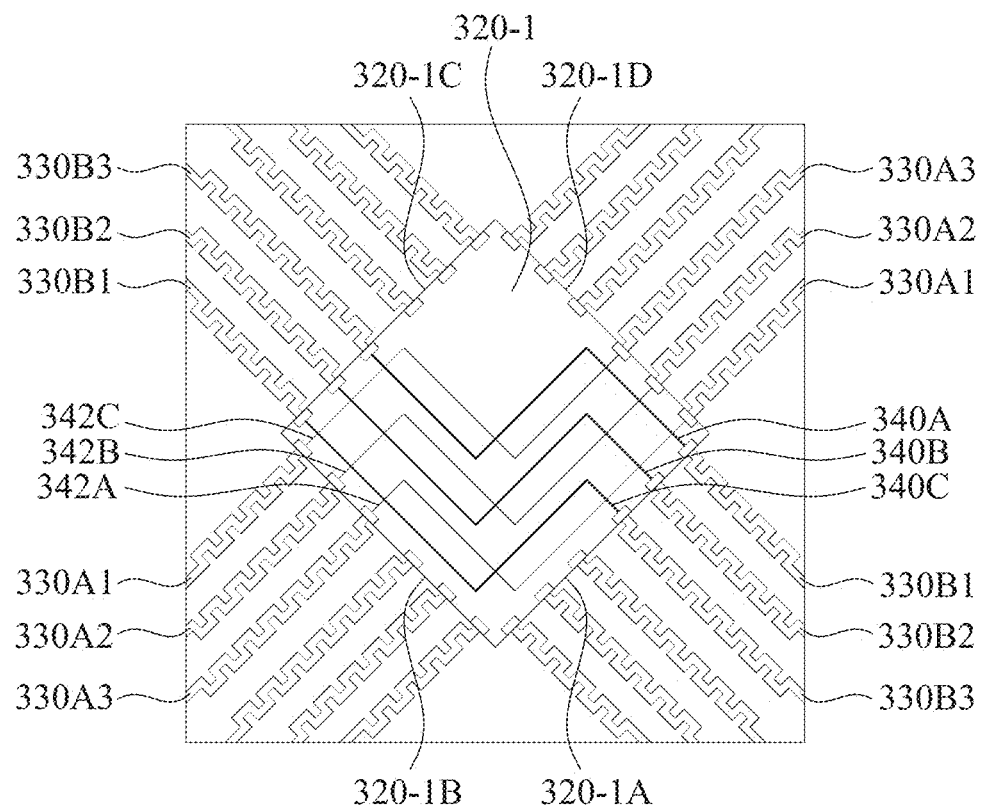
FIG. 3D is a partial enlarged view of FIG. 3C.

FIGS. 3C and 3D illustrate the coupling ways between traces on different sides of the pixel island and the conductive lines inside the pixel island. For clarity and illustration, only some of the internal conductive lines coupled with the traces and in the first pixel island 320-1 are shown, while the other internal conductive lines are not shown. FIG. 3C is a partial enlarged view of FIG. 3A. The first side 320-1A, second side 320-1B, third side 320-1C, and fourth side 320-1D of the first pixel island 320-1 respectively have traces 330A1, 330A2, 330A3, 330B1, 330B2, and 330B3. Traces 330A1, 330A2 and 330A3 connect one adjacent pixel island, while traces 330B1, 330B2 and 330B3 connect another adjacent pixel island.

For illustration purpose, the traces 330 connecting the first side 320-1A are referred to as the first traces, the traces connecting the second side 320-1B are referred to as the second traces, the traces connecting the third side 320-1C are referred to as the third traces, and the traces connecting the fourth side 320-1D are referred to as the fourth traces.

The first pixel island 320-1 has a plurality of conductive lines inside to couple the traces on different sides. As shown in FIG. 3C, the first traces 330B1, 330B2 and 330B3 on the first side 320-1A are coupled to the third traces 330B3, 330B2 and 330B1 on the third side 320-1C via conductive lines 340A, 340B and 340C, respectively. The second traces 330A1, 330A2 and 330A3 on the second side 320-1B are coupled to the fourth traces 330A3, 330A2 and 330A1 on the fourth side 320-1D via conductive lines 342C, 342B and 342A, respectively. In the first pixel island 320-1, conductive lines 340A, 340B, and 340C and conductive lines 342A, 342B, and 342C are separated and not connected to each other. For example, conductive lines 340A, 340B, and 340C are located in a level of the first pixel island 320-1, while conductive lines 342A, 342B, and 342C are located in another level of the first pixel island 320-1.

FIG. 3D is a partial enlarged view of FIG. 3C. In detail, the internal conductive lines 340A, 340B and 340C of the first pixel island 320-1 are arranged on the first side 320-1A in such a way that the conductive line 340A is located at the outermost position, and the conductive line 340C is located at the innermost position; the internal conductive lines 340A, 340B and 340C on the third side 320-1C are arranged in such a way that the conductive line 340A is located at the innermost position, and the conductive line 340C is located at the outermost position. Similarly, the internal conductive lines 342A, 342B and 342C of the first pixel island 320-1 are arranged on the second side 320-1B in such a way that the conductive line 342C is located at the outermost position, and the conductive line 342A is located at the innermost position; the internal conductive lines 342A, 342B and 342C on the fourth side 320-1D are arranged in such a way that the conductive line 342C is located at the innermost position and the conductive line 342A is located at the outermost position.

In the first pixel island 320-1, the first trace 330-B1 at the outermost position of the first side 320-1A is coupled to the third trace 330-B3 at the innermost position of the third side 320-1C via the conductive line 340A. The first trace 330-A3 at the innermost position of the first side 320-1A is coupled to the third trace 330-B1 at the outermost position of the third side 320-1C via the conductive line 340C. Similarly, the second trace 330-A1 at the outermost position of the second side 320-1B is coupled to the fourth trace 330-A3 at the innermost position of the fourth side 320-1D via the conductive line 342C. The second trace 330-A3 at the innermost position of the second side 320-1B is coupled to the fourth trace 330-A1 at the outermost position of the fourth side 320-1D via the conductive line 342A.

As shown in FIG. 3C, among the six traces on the same side, the two outermost traces have the shortest length, while the two innermost traces have the longest length. The outermost traces on one side are coupled with the innermost traces on another side, and the innermost traces on said one side are coupled with the outermost traces of said another side; this coupling way can make the lengths of different conductive paths consistent, thus resulting in consistent resistance values of these different conductive paths.

Figure 3E:
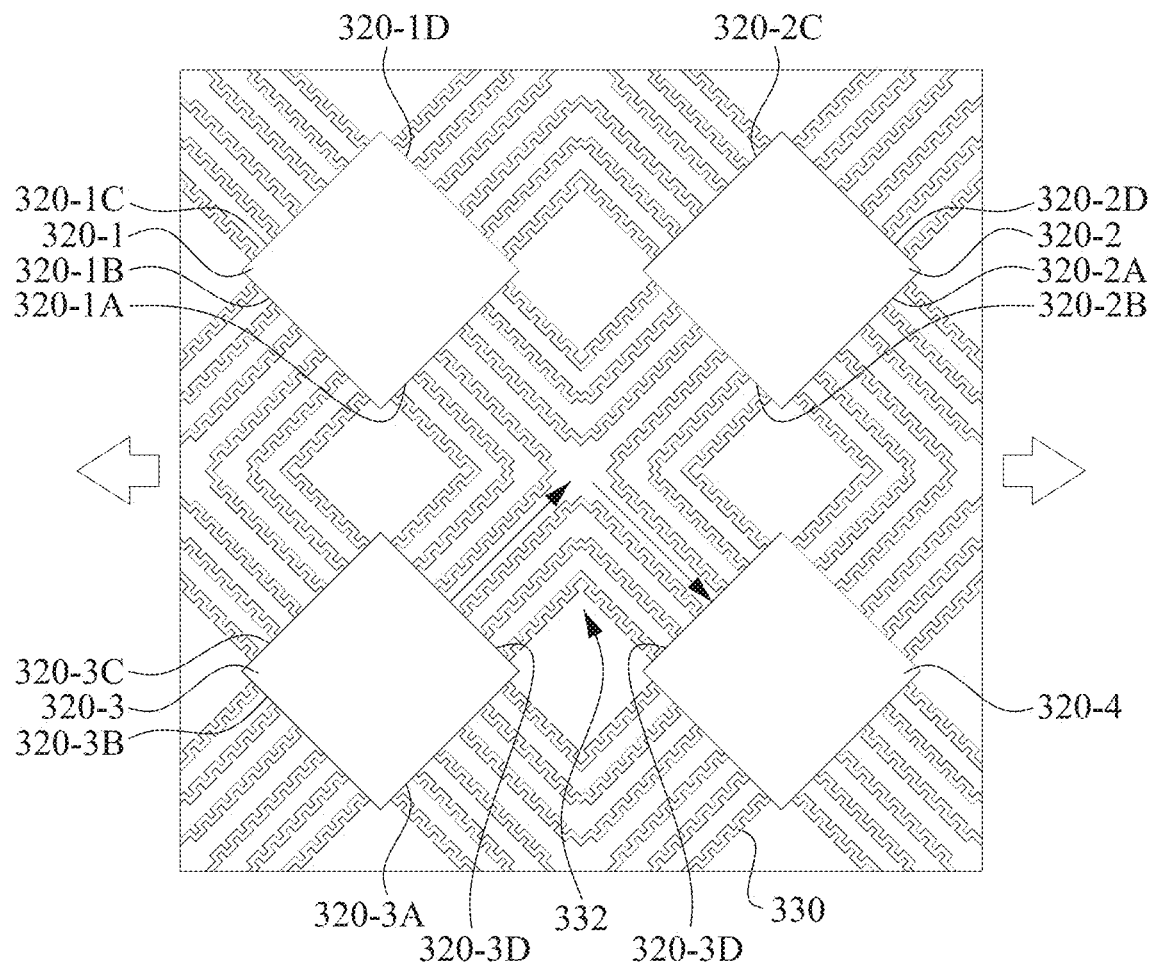
FIG. 3E is a partial enlarged view of FIG. 3A.

FIG. 3E is a partial enlarged view of FIG. 3A. The hollow arrows near two opposite sides indicate the direction to be stretched along a single axis, and the solid single arrow indicates the first main direction and the second main direction of the trace extension. Each of the traces 330 extends in the first main direction and then extends in the second main direction through a turning angle. In some embodiments, for example, when the display device is a dynamic stretchable panel, before the display device is stretched, the angle between the direction to be stretched and one side of the pixel island may be about 30° to 60°, for example, about 45°, as shown in FIG. 3E. Alternatively, the angle between one of the main extending directions of the traces 330 and the direction to be stretched may be about 35° to 55°, for example, about 45°, as shown in FIG. 3E. In some embodiments, after the substrate is stretched, the angle between the stretching direction of the substrate and one side of the pixel island can be changed to about 20° to 70°, the angle between one of the main extending directions of the traces and the stretching direction is about 2.5° to 52.5°.

Figure 4:
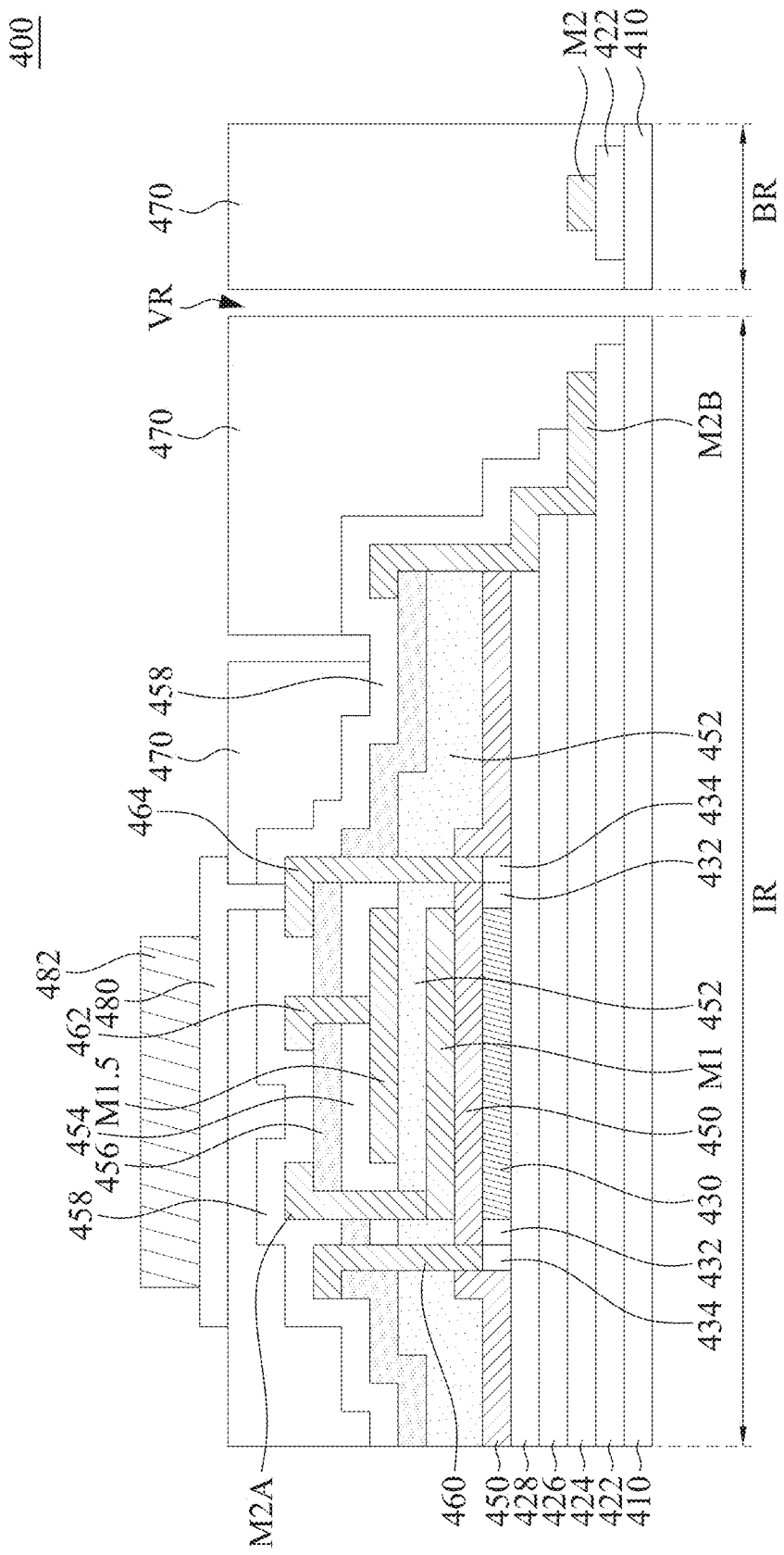
FIG. 4 is a cross-sectional view of a display device according to some embodiments.

FIG. 4 shows a partial cross-sectional view of a display device according to some embodiments. It is understood that FIG. 4 is an example, and the display device of the present disclosure is not limited thereto. FIG. 4 shows parts of a pixel island region IR and a bridge region BR of a display device 400.

As shown in FIG. 4, the bridge region BR comprises a substrate 410, an insulating layer 422 over the substrate, a conductive material M2 over the insulating layer 422, and an encapsulation layer 470. The encapsulation layer 470 covers the substrate 410, the insulating layer 422, and the conductive material M2.

The pixel island region IR and the bridge region BR are separated by a void region VR. In the pixel island region IR, optionally, a plurality of insulating layers 422, 424, 426, and 428 are formed over the substrate 410. In some embodiments, the material of the insulating layers 422, 424, 426, and 428 may be silicon oxide or silicon nitride.

An active element 430 is disposed over the insulating layer 428, and the source/drain region 432 and the source/drain region 434 are disposed near two sides of the active element 430. Gate insulating layers 450 and 452 are disposed over the active element 430. Insulating layers 454 and 456 are disposed over the gate insulating layers 450 and 452. An interlayer dielectric layer 458 is disposed over the insulating layer 456. The encapsulation layer 470 is disposed over the interlayer dielectric layer 458.

A conductive pattern M1 may be disposed between the gate insulating layers 450 and 452, and a conductive pattern M1.5 may be disposed between the gate insulating layer 452 and the insulating layer 454. The conductive connection patterns 460, 462, and 464 include portions passing through the gate insulating layers 450 and 452 or the insulating layers 454 and 456, to provide electrical connections between the different levels.

The conductive materials M2A and M2B in the pixel island region IR include vertical portions passing through gate insulating layers 450 and 452 or insulating layers 454 and 456 to provide electrical connections between the different levels. The conductive material M2 in the bridge region Br is electrically coupled with the conductive materials M2A and M2B in the pixel island region IR. That is, the conductive material M2 in the bridge region Br is formed as a trace 330, and the conductive materials M2A and M2B in the pixel island region IR are formed as internal conductive lines coupled to the trace 330 and in the pixel island region IR (for example, the conductive lines 340A, 340B, 340C, 342A, 342B, or 342C shown in FIGS. 3C and 3D). As shown in FIG. 4, the horizontal extending portion of the conductive material M2A and the horizontal extending portion of the conductive material M2B are respectively located at different levels in the pixel island region IR.

An electrode 480 is disposed over the encapsulation layer 470, and the electrode 480 is electrically connected to the conductive connection pattern 464. A light emitting element 482 is disposed over the electrode 480. The light emitting element 482 can be, for example, an organic LED, a micro LED, or the like.

Figure 5:
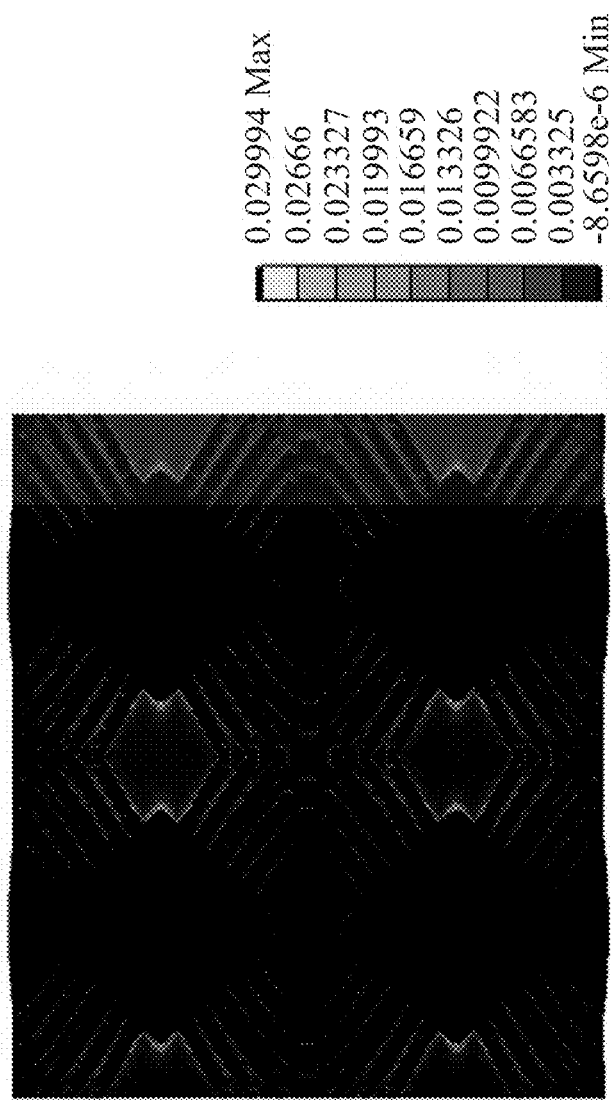
FIG. 5 is a stress-tension deformation distribution diagram of a display device according to one example.

FIG. 5 is a stress distribution diagram of a display device according to an example after the display device is stretched. In the region of pixel island the tensile strain is close to 0, while in the trace the tensile strain is about 3%. In contrast, in a comparative example that adopts a conventional trace design (i.e., the trace does not include a turning angle), the tensile strain of the conventional trace is about 6.6%. Therefore, compared with the trace without a turning angle, the trace with a turning angle can reduce the strain by 55%.

In some embodiments, in the display device, the turning angle of the traces is 70° to 110° before the stretchable substrate is subjected to tensile stress. In some embodiments, in the display device, the turning angle of the turning angle when or after the stretchable substrate is subjected to tensile stress is 75° to 175°.

Figure 6A:
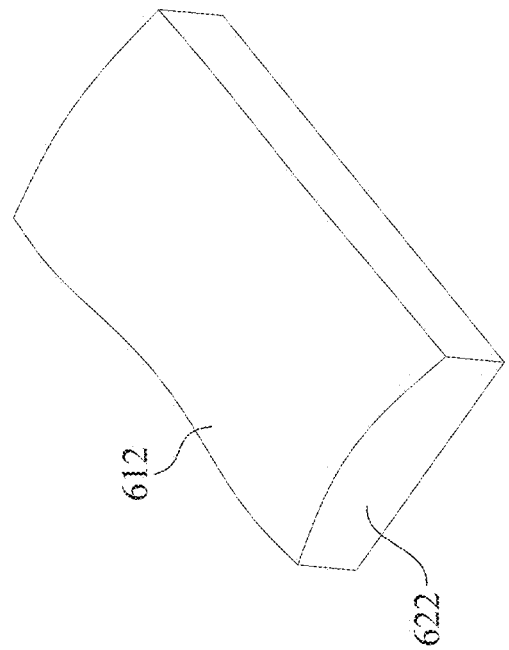
FIG. 6A is a schematic diagram of a curved panel according to some embodiments.
Figure 6B:
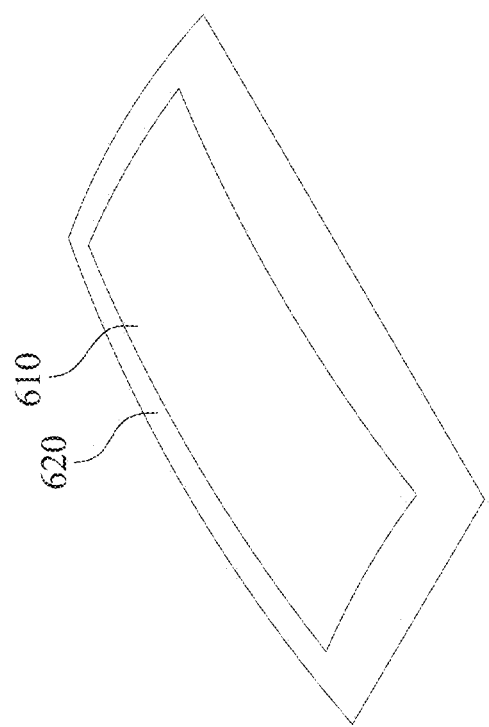
FIG. 6B is a schematic diagram of a curved panel according to some embodiments.

The display device of the present disclosure can be applied to repeatedly stretchable display devices as shown in FIGS. 1A and 1B, or can be applied to fixed curved display devices as shown in FIGS. 6A and 6B. FIG. 6A illustrates a convex display device 610, which is shaped into a convex shape by being attached to a convex mold 620, so that the substrate and traces in local regions will have tensile deformation and compressive deformation. FIG. 6B illustrates a concave display device 612, which is shaped into a concave shape by being attached to a concave mold 622, so that the substrate and traces in local regions will have tensile deformation and compressive deformation.

Compared with the prior art, the display devices of the various embodiments of the disclosure have traces with improved tensile stress bearing capacity through the design of the turning angle of the traces, so that when the display device is stretched or bent, the metal traces connecting the pixel islands are not easy to break, thereby improving the reliability of the display device when the display device is stretched or bent.

Although the present disclosure has been disclosed in many embodiments and examples, it is not intended to limit the present disclosure. Anyone skilled in the art can make various changes and modifications without departing from the spirit and scope of the present disclosure. Therefore, the scope of protection of the present disclosure shall be subject to the scope of the appended claims.

What is claimed is:

1. A display device comprising:
a substrate, wherein the substrate is stretchable;
a plurality of pixel islands, disposed over the substrate; and
a plurality of traces, respectively connecting two adjacent pixel islands of the plurality of pixel islands, wherein each of the plurality of traces extends in a first main direction and then extends in a second main direction through a turning angle;
wherein the plurality of pixel islands comprises a first pixel island, a second pixel island, and a third pixel island, some of the traces extending from one side of the first pixel island connect one side of the second pixel island, and others of the traces extending from the first pixel island connect one side of the third pixel island;
wherein the first pixel island has a first side, a second side, a third side, and fourth side, the first side intersects the second side and is opposite to the third side, the second side intersects the third side and is opposite to the fourth side;
wherein the plurality of traces comprises first traces, second traces, third traces, and fourth traces, the first side of the first pixel island is connected with the first traces, the second side is connected with the second traces, the third side is connected with the third traces, and the fourth side is connected with the fourth traces; and
wherein the first traces on the first side are respectively electrically coupled to the third traces on the third side, and the second traces on the second side a are respectively electrically coupled to the fourth traces on the fourth side.

2. The display device of claim 1, wherein the turning angle is 70° to 110° before the substrate is subjected to tensile stress.

3. The display device of claim 1, wherein the turning angle is 75° to 175° when the substrate is subject to tensile stress.

4. The display device of claim 1, wherein the traces extending from one side of one pixel island of the pixel islands connect one side of another pixel island of the pixel islands.

5. The display device of claim 1, wherein an angle between one side of each of the pixel islands and a direction to be stretched of the substrate is 30° to 60°.

6. The display device of claim 1, wherein an angle between a main extending direction of the traces and a direction to be stretched of the substrate is 35° to 55°.

7. The display device of claim 1, wherein some of the traces extending from another side of the first pixel island connect another side of the second pixel island.

8. The display device of claim 1, wherein the first pixel island has a plurality of first conductive lines and a plurality of second conductive lines, the first traces on the first side are respectively electrically coupled to the third traces on the third side via the first conductive lines, and the second traces on the second side are respectively electrically coupled to the fourth traces on the fourth side via the second conductive lines.

9. The display device of claim 8, wherein the first conductive lines and the second conductive lines are located at different levels in the first pixel island.

10. The display device of claim 1, wherein an outermost trace of the first traces on the first side are respectively electrically coupled to an innermost trace of the third traces on the third side, and an innermost trace of the first traces on the first side are respectively electrically coupled to an outermost trace of the third traces on the third side.

11. The display device of claim 1, wherein respective conductive paths from the first traces to the third traces are approximately equal in length.

12. The display device of claim 1, wherein some of the traces extending from the first side of the first pixel island connect one side of the second pixel island, and others of the traces extending from the first side of the first pixel island connect one side of the third pixel island.

13. A display device comprising:
a substrate, wherein the substrate is stretchable;
a plurality of pixel islands, disposed over the substrate; and
a plurality of traces, respectively connecting two adjacent pixel islands of the plurality of pixel islands, wherein each of the plurality of traces extends in a first main direction and then extends in a second main direction through a turning angle;
wherein the plurality of pixel islands comprises a first pixel island, a second pixel island, and a third pixel island, some of the traces extending from a first side of the first pixel island connect one side of the second pixel island, and others of the traces extending from the first side of the first pixel island connect one side of the third pixel island.

14. The display device of claim 13, wherein some of the traces extending from another side of the first pixel island connect another side of the second pixel island.

15. The display device of claim 13, wherein:
the first pixel island has the first side, a second side, a third side, and a fourth side, the first side intersects the second side and is opposite to the third side, the second side intersects the third side and is opposite to the fourth side;
the plurality of traces comprises first traces, second traces, third traces, and fourth traces, the first side of the first pixel island is connected with the first traces, the second side is connected with the second traces, the third side is connected with the third traces, and the fourth side is connected with the fourth traces;
the first traces on the first side are respectively electrically coupled to the third traces on the third side, and the second traces on the second side are respectively electrically coupled to the fourth traces on the fourth side; and
the first pixel island has a plurality of first conductive lines and a plurality of second conductive lines, the first traces on the first side are respectively electrically coupled to the third traces on the third side via the first conductive lines, and the second traces on the second side are respectively electrically coupled to the fourth traces on the fourth side via the second conductive lines.

16. The display device of claim 15, wherein the first conductive lines and the second conductive lines are located at different levels in the first pixel island.

17. The display device of claim 15, wherein an outermost trace of the first traces on the first side are respectively electrically coupled to an innermost trace of the third traces on the third side, and an innermost trace of the first traces on the first side are respectively electrically coupled to an outermost trace of the third traces on the third side.

18. The display device of claim 15, wherein respective conductive paths from the first traces to the third traces are approximately equal in length.

* * * * *